(12) United States Patent
Tohyama et al.

(10) Patent No.: US 7,574,005 B2
(45) Date of Patent: Aug. 11, 2009

(54) HOWLING FREQUENCY COMPONENT EMPHASIS METHOD AND APPARATUS

(75) Inventors: Mikio Tohyama, Tokyo (JP); Yoshinori Takahashi, Tokyo (JP); Hiroaki Fujita, Hamamatsu (JP); Hiraku Okumura, Hamamatsu (JP)

(73) Assignee: Yamaha Corporation, Hamamatsu-Shi (JP)

( * ) Notice: Subject to any disclaimer, the term of this patent is extended or adjusted under 35 U.S.C. 154(b) by 940 days.

(21) Appl. No.: 11/094,054

(22) Filed: Mar. 29, 2005

(65) Prior Publication Data

US 2005/0220313 A1    Oct. 6, 2005

(30) Foreign Application Priority Data

Mar. 30, 2004 (JP) ............................ 2004-101570
Feb. 25, 2005 (JP) ............................ 2005-049868

(51) Int. Cl.
*H04B 3/20* (2006.01)
*H03G 5/00* (2006.01)

(52) U.S. Cl. ........................................ 381/66; 381/98

(58) Field of Classification Search .................. 381/56, 381/66, 98; 379/406.01, 406.02, 406.05, 379/406.06, 406.08, 406.12–406.16; 370/286; 455/570
See application file for complete search history.

(56) References Cited

U.S. PATENT DOCUMENTS 5,661,813 A * 8/1997 Shimauchi et al. ............. 381/66
5,664,011 A * 9/1997 Crochiere et al. ...... 379/406.08
5,761,318 A * 6/1998 Shimauchi et al. ............. 381/66
6,246,760 B1 * 6/2001 Makino et al. .......... 379/406.08
6,738,358 B2 * 5/2004 Bist et al. .................... 370/289
6,950,513 B2 * 9/2005 Hirai et al. ............. 379/406.11
7,130,428 B2 * 10/2006 Hirai et al. ..................... 381/66

FOREIGN PATENT DOCUMENTS

| EP | 0 843 502 | 5/1998 |
| JP | 06-164278 | 6/1994 |
| JP | 08-223683 | 8/1996 |
| JP | 3134557 | 12/2000 |
| WO | WO-03/079721 | 9/2003 |

* cited by examiner

*Primary Examiner*—Xu Mei
(74) *Attorney, Agent, or Firm*—Morrison & Foerster LLP

(57) ABSTRACT

A method is designed for emphasizing a howling frequency component of a sound signal observed in an acoustic feedback system during an observation period having a predetermined length. The method is carried out by the steps of successively sampling the sound signal from the acoustic feedback system to provide a running set of samples of the sound signal during the observation period such that a total number of the samples in the running set increments each time one or more of new sample is added to the running set until the total number of the samples corresponds to the predetermined length of the observation period, recurrently calculating a running frequency characteristic of the sound signal on a common frequency axis for the observation period from the running set of the samples each time one ore more of new sample is added to the running set, and accumulating the recurrently calculated running frequency characteristics on the common frequency axis so as to emphasize a howling frequency component contained in the sound signal.

48 Claims, 11 Drawing Sheets

HOWLING FREQUENCY COMPONENT EMPHASIS METHOD AND APPARATUS

BACKGROUND OF THE INVENTION

1. Technical Field

The present invention generally relates to a signal processing method of emphasizing a relatively high peak frequency component among a plurality of peak frequency components of a sound signal, and specifically relates to a method of acquiring frequency characteristics emphasizing a frequency component causing howling (hereafter referred to as a "howling frequency component") and its apparatus in order to contribute to improvement of the precision for distinction between the sound signal and howling noise. Further, the present invention relates to a method of detecting howling by using the howling frequency component emphasis method and its apparatus. Moreover, the present invention relates to a method of suppressing howling by using the howling detection method and its apparatus.

2. Related Art

There is known a sound amplification system so configured that a microphone and a speaker is arranged in a space such as a hall, and the speaker amplifies the sound picked up by the speaker. In such system, the microphone re-picks up the sound amplified by the speaker to make up a so-called acoustic feedback system, and possibly cause howling. Conventionally, there has been available a technique to suppress howling in the acoustic feedback system. Such technique always applies frequency analysis to a sound signal collected by a microphone, then detects a peak frequency having the maximum amplitude, and decreases a gain of the detected peak frequency.

The following patent documents describe the prior art of detecting howling frequencies in an acoustic feedback system and decreasing a gain of the detected peak frequency to suppress the howling.

[Patent document 1] Patent Publication No. 3134557
[Patent document 2] Japanese Non-examined Patent Publication No. 8-223683

The conventional technique suppresses howling based on the simple peak detection. The technique cannot clearly distinguish between frequency peak components of the sound (such as a musical sound) and a howling peak until the howling grows up to a sufficient amplitude. It has been impossible to fast detect the howling before the howling reaches the maximal strength.

SUMMARY OF THE INVENTION

The present invention has been made in consideration of the foregoing. It is therefore an object of the present invention to provide a howling frequency component emphasis method and apparatus to contribute to improvement of the precision for distinction between sound signal and howling noise. It is another object of the present invention to provide a method and apparatus to detect howling using the howling frequency component emphasis method. It is yet another object of the present invention to provide a method and apparatus to suppress howling using the howling detection method.

In one aspect of the invention, a method is designed for emphasizing a peak frequency component of a sound signal inputted during an observation period having a predetermined length. The inventive method comprises the steps of successively sampling the sound signal to provide a running set of samples of the sound signal inputted during the observation period such that a number of the samples in the running set increments each time one or more of new sample is added to the running set until the number of the samples corresponds to the predetermined length of the observation period, recurrently calculating a running frequency characteristic of the sound signal on a common frequency axis for the observation period from the running set of the samples each time one ore more of new sample is added to the running set, accumulating the recurrently calculated running frequency characteristics on the common frequency axis so as to emphasize a peak frequency component contained in the sound signal, and outputting a frequency spectrum representing the emphasized peak frequency component based on the accumulated running frequency characteristics.

Specifically, an inventive method is designed for emphasizing a howling frequency component of a sound signal observed in an acoustic feedback system during an observation period having a predetermined length. The inventive method comprises the steps of successively sampling the sound signal from the acoustic feedback system to provide a running set of samples of the sound signal during the observation period such that a number of the samples in the running set increments each time one or more of new sample is added to the running set until the number of the samples corresponds to the predetermined length of the observation period, recurrently calculating a running frequency characteristic of the sound signal on a common frequency axis for the observation period from the running set of the samples each time one ore more of new sample is added to the running set, accumulating the recurrently calculated running frequency characteristics on the common frequency axis so as to emphasize a howling frequency component contained in the sound signal, and outputting a frequency spectrum representing the emphasized howling frequency component based on the accumulated running frequency characteristics.

Preferably, the inventive method further comprises the step of separating the running frequency characteristic into a real part and an imaginary part, so that the accumulating step accumulates the real part of the running frequency characteristic on the common frequency axis and accumulates the imaginary part of the running frequency characteristic on the common frequency axis independently from the real part, and then combines the accumulated real parts and the accumulated imaginary parts with each other to provide a composite frequency characteristic which is equivalent to the accumulated running frequency characteristics.

In another aspect of the invention, a method is designed for emphasizing a howling frequency component of a sound signal observed in an acoustic feedback system during an observation period having a predetermined length. The inventive method comprises the steps of successively sampling the sound signal from the acoustic feedback system to provide a running set of samples of the sound signal arranged on a common time axis such that a number of the samples in the running set increments each time one or more of new sample is added to the running set until the number of the samples corresponds to the predetermined length of the observation period, accumulating the running set of the samples on the common time axis each time one or more of new sample is added to the running set so as to emphasize a howling frequency component contained in the sound signal, calculating a frequency characteristic of the accumulated running sets of the samples, and outputting a frequency spectrum presenting the emphasized howling frequency component based on the calculated frequency characteristic.

In a further aspect of the invention, a method is designed for emphasizing a howling frequency component of a sound signal observed in an acoustic feedback system during an observation period having a predetermined length. The inventive method comprises the steps of successively sampling the sound signal from the acoustic feedback system to provide a running set of samples of the sound signal arranged on a common time axis in the order from early samples to recent samples so that a number of the samples in the running set increments each time one or more of new sample is added after the recent samples of the running set until the number of the samples corresponds to the predetermined length of the observation period, recurrently weighting each sample contained in the running set using a triangular function each time one or more of new sample is added to the running set such that the early samples are weighted greater than the recent samples so as to emphasize a howling frequency component of the sound signal, calculating a frequency characteristic of the sound signal for the observation period based on the running sets each containing the recurrently weighted samples, and outputting a frequency spectrum presenting the emphasized howling frequency component based on the calculated frequency characteristic.

Preferably, the sampling step pre-weights each sample of the sound signal successively sampled during the observation period by using a signal analysis window function which is provided to cover the predetermined length of the observation period, so that the running set is composed of the pre-weighted samples. For example, the sampling step uses an inverse index window function as the signal analysis window function, such that early samples in the observation period is pre-weighted greater than recent samples in the same observation period. Otherwise, the sampling step uses the samples of the sound signal as the signal analysis window function for pre-weighting the samples, so that each pre-weighted sample is provided in the form of a square of each sample.

Preferably, the sampling step includes adding a number of zeros corresponding to a number of absent samples not yet acquired from the sound signal, to the running set of present samples already acquired from the sound signal so as to form an extended running set which has a fixed length corresponding to the predetermined length of the observation period and which contains both of the present samples and the absent samples in the form of zeros.

preferably, the outputting step is executed to produce the frequency spectrum every time the number of the samples in the running set increases by a predetermined number within the observation period.

Preferably, the sampling step finishes the sampling of the sound signal in a current observation period when the number of the samples corresponds to the predetermined length of the observation period and restarts the sampling of the sound signal in a next observation period.

Preferably, the inventive method further includes the step of detecting an actual howling frequency from the frequency spectrum containing one or more of the emphasized howling frequency component.

Further, the inventive method includes the step of controlling a filter inserted in the acoustic feedback system according to the detected howling frequency so as to reduce a gain of a frequency range of the sound signal around the detected howling frequency.

In a still another aspect of the invention, there is provided an apparatus capable of emphasizing a howling frequency component of a sound signal observed in an acoustic feedback system during an observation period having a predetermined length. The inventive apparatus comprises a sampling section that is provided with a memory and that successively samples the sound signal from the acoustic feedback system and sequentially writes samples of the sound signal into the memory to thereby provide a running set of the samples in the memory such that a number of the samples in the running set increments each time one or more of new sample is added to the running set until the number of the samples corresponds to the predetermined length of the observation period, a calculating section that recurrently reads out the running set of the samples from the memory each time one ore more of new sample is added to the running set, and that recurrently calculates a running frequency characteristic of the sound signal on a common frequency axis for the observation period from the recurrently read running set of the samples, an accumulating section that accumulates the recurrently calculated running frequency characteristics on the common frequency axis so as to emphasize a howling frequency component contained in the sound signal, and an output section that produces an output frequency spectrum representing the emphasized howling frequency component from the accumulated running frequency characteristics.

Preferably, the inventive apparatus further comprises a separating section that separates the running frequency characteristic into a real part and an imaginary part, so that the accumulating section accumulates the real part of the running frequency characteristic on the common frequency axis and accumulates the imaginary part of the running frequency characteristic on the common frequency axis independently from the real part, and then combines the accumulated real parts and the accumulated imaginary parts with each other to provide a composite frequency characteristic which is equivalent to the accumulated running frequency characteristics.

In a further aspect of the invention, there is provided an apparatus capable of emphasizing a howling frequency component of a sound signal observed in an acoustic feedback system during an observation period having a predetermined length. The inventive apparatus comprises a sampling section that is provided with a memory and that successively samples the sound signal from the acoustic feedback system and sequentially writes samples of the sound signal into the memory to thereby define a running set of the samples arranged sequentially along a common time axis such that a number of the samples in the running set increments each time one or more of new sample is added to the running set until the number of the samples corresponds to the predetermined length of the observation period, an accumulating section that recurrently reads out the running set of the samples from the memory each time one or more of new sample is added to the running set, and that accumulates the recurrently read running sets of the samples on the common time axis so as to emphasize a howling frequency component contained in the sound signal, a calculating section that calculates a frequency characteristic of the accumulated running sets of the samples, and an output section that produces an output frequency spectrum presenting the emphasized howling frequency component based on the calculated frequency characteristic.

In a further aspect of the invention, there is provided an apparatus capable of emphasizing a howling frequency component of a sound signal observed in an acoustic feedback system during an observation period having a predetermined length. The inventive apparatus comprises a sampling section that is provided with a memory and that successively samples the sound signal from the acoustic feedback system and sequentially writes samples of the sound signal into the memory to thereby define a running set of the samples arranged along a common time axis sequentially from early samples to recent samples so that a number of the samples in the running set increments each time one or more of new sample is added after the recent samples of the running set until the number of the samples corresponds to the predetermined length of the observation period, a weighting section that recurrently reads out the running set of the samples from the memory each time one or more of new sample is added to the running set, and that weights each sample contained in the recurrently read running set using a triangular function such that the early samples are weighted greater than the recent samples so as to emphasize a howling frequency component of the sound signal, a calculating section that calculates a frequency characteristic of the sound signal for the observation period based on the recurrently read running sets each containing the weighted samples, and an output section that produces an output frequency spectrum presenting the emphasized howling frequency component based on the calculated frequency characteristic.

Preferably, the sampling section includes a pre-weighting section that pre-weights each sample of the sound signal successively sampled during the observation period by using a signal analysis window function which is provided to cover the predetermined length of the observation period so that the running set is composed of the pre-weighted samples. For example, the pre-weighting section uses an inverse index window function as the signal analysis window function such that early samples in the observation period is pre-weighted greater than recent samples in the same observation period. Otherwise, the pre-weighting section uses the samples of the sound signal as the signal analysis window function for pre-weighting the samples, so that each pre-weighted sample is provided in the form of a square of each sample.

Preferably, the inventive apparatus further includes a detecting section that detects an actual howling frequency from the output frequency spectrum containing one or more of the emphasized howling frequency component.

Preferably, the inventive apparatus further includes an adaptive filter section that is inserted in the acoustic feedback system and that is controlled according to the detected howling frequency so as to reduce a gain of a frequency range of the sound signal around the detected howling frequency.

The howling frequency component emphasis method according to the present invention can obtain a frequency characteristic with an emphasized howling frequency component. Accordingly, it is possible to improve the accuracy of distinction between sound and howling, and fast detect and suppress the howling.

Let us assume that a sound signal is observed in an acoustic feedback system. Each time a new sound signal sample is observed in a specified observation period, a frequency characteristic is calculated for the entire observation period. The calculated frequency characteristics are accumulated with reference to a common frequency axis to obtain a frequency characteristic with an emphasized howling frequency component. This is because howling frequency components undergo a transition in the same phase. That is, howling frequency components undergo a transition in the same phase, and therefore simply increase when frequency characteristics are accumulated with reference to the frequency axis. On the contrary, phases vary for frequency components of the sound other than the howling frequencies. Those frequency components do not simply increase when frequency characteristics are accumulated with reference to the frequency axis. Therefore, accumulating frequency characteristics over the common frequency axis can provide a frequency characteristic with an emphasized howling frequency component. Further, howling frequency components simply increase when the sound signal samples themselves are accumulated with reference to the frequency axis. Frequency components of the sound other than howling frequencies do not simply increase. Let us suppose that the sound signal samples themselves are accumulated with reference to a time axis, and then a frequency characteristic is found. Even in this case, the resulting frequency characteristic has an emphasized howling frequency component.

Let us assume that a sound signal is observed in an acoustic feedback system. Each time a new sound signal sample is observed in a specified observation period, a frequency characteristic is calculated for the entire observation period. The calculated frequency characteristics are accumulated with reference to the frequency axis to obtain a frequency characteristic with an emphasized howling frequency component. The rationale for this will be described in more detail. Each time a new sound signal sample is observed in a specified observation period, a frequency characteristic is calculated for the entire observation period. The calculated frequency characteristics are accumulated. This is defined as ARS (Accumulated Running Spectrum).

[1] ARS in z Transform Representation

Let us suppose the z transform of progression h(n) to be:

$$H(z^{-1}) \equiv \sum_n h(n)z^{-n}$$

Then, the z transform representation for the ARS will be:

$$ARS(n, z^{-1}) \equiv \sum_{m=0}^{n} H_m(z^{-1}) = \sum_{m=0}^{n} (n+1-m)h(m)z^{-m} \quad (1)$$

$$\equiv \sum_{m=0}^{n} w(n)h(m)z^{-m} \text{ where}$$

$$H_m z^{-1} \equiv \sum^{m} h(1)z^{-1}$$

That is, the ARS can be defined as the z transform weighted by a triangular window function. for example, the ARS can be expressed as follows.

$$ARS(3, z^{-1}) \equiv H_0(z^{-1}) + H_1(z^{-1}) + H_2(z^{-1}) + H_3(z^{-1}) \quad (2)$$

$$= h(0) + h(0) + h(1)z^{-1} + h(0) + h(1)z^{-1} + h(2)z^{-2} +$$

$$h(0) + h(1)z^{-1} + h(2)z^{-2} + h(3)z^{-3}$$

$$= 4h(0) + 3h(1)z^{-1} + 2h(2)z^{-2} + h(3)z^{-3}$$

[2] Representing a Pole Using the ARS

A pole of transfer function causes howling. A transfer function pole can be represented in ARS using the following transfer function example in a geometric sequence.

$$H(z^{-1}) \equiv (1 + az^{-1})(1 + az^{-2})(1 + az^{-4})(1 + az^{-8})L \rightarrow \frac{1}{1 - az^{-1}} \quad (3)$$

The ARS at pole z=a is represented as follows.

$$ARS(0, z^{-1})|_{z=a} = 1 \quad (4)$$

-continued $$ARS(1, z^{-1})|_{z=a} = 1 + 1 + az^{-1}|_{z=a} = 1 + 2 = 3$$

$$ARS(2, z^{-1})|_{z=a} = 3 + 1 + az^{-1}|_{z=a} + a^2 z^{-2}|_{z=a} = 1 + 2 + 3 = 6$$

$$ARS(3, z^{-1})|_{z=-a} = 6 + 1 + az^{-1}|_{z=-a} + a^2 z^{-2}|_{z=-a} + a^3 z^{-3}|_{z=-a}$$
$$= 1 + 2 + 3 + 4 = 10$$

$$ARS(4, z^{-1})|_{z=-a} = 10 + 1 + az^{-1}|_{z=-a} + a^2 z^{-2}|_{z=-a} +$$
$$a^3 z^{-3}|_{z=-a} + a^4 z^{-4}|_{z=-a}$$
$$= 1 + 2 + 3 + 4 + 5 = 15$$

$$\vdots$$

$$ARS(n, z^{-1})|_{z=-a} = \frac{(n+2)(n+1)}{2}$$

That is, the pole can be emphasized by an increasing sequence that increases in proportion to $n^2$.

[3] Signal Analysis Window Function

In order to principally explain the ARS, the above-mentioned example has described the method of extracting an observation signal using a rectangular window function and then accumulating its z transform. However, the accumulation method is not limited thereto. Instead of the rectangular window function, it is possible to accumulate analysis results according to the above-mentioned accumulation principle using any window functions including Hanning and Hamming functions that are conventionally used for the signal analysis. In order to further emphasize the pole, it is also possible to analyze an observation signal by multiplying it by any signal analysis window functions. Among various signal analysis window functions, the inverse index window function can especially emphasize transfer characteristics. In a specific case, the observation signal itself can be used as the signal analysis window function.

As mentioned above, the ARS uses a frequency analysis result accumulated for a specified signal sample to observe the growth of a response due to the transfer function's pole. When a plurality of poles is distributed in the transfer function, the most fast growing pole is emphasized. As a result, the ARS provides effective means for extracting transfer characteristics from a response signal against a fluctuating input signal such as a music sound.

BRIEF DESCRIPTION OF THE DRAWINGWS

DETAILED DESCRIPTION OF THE INVENTION

Embodiment 1

Figure 1:
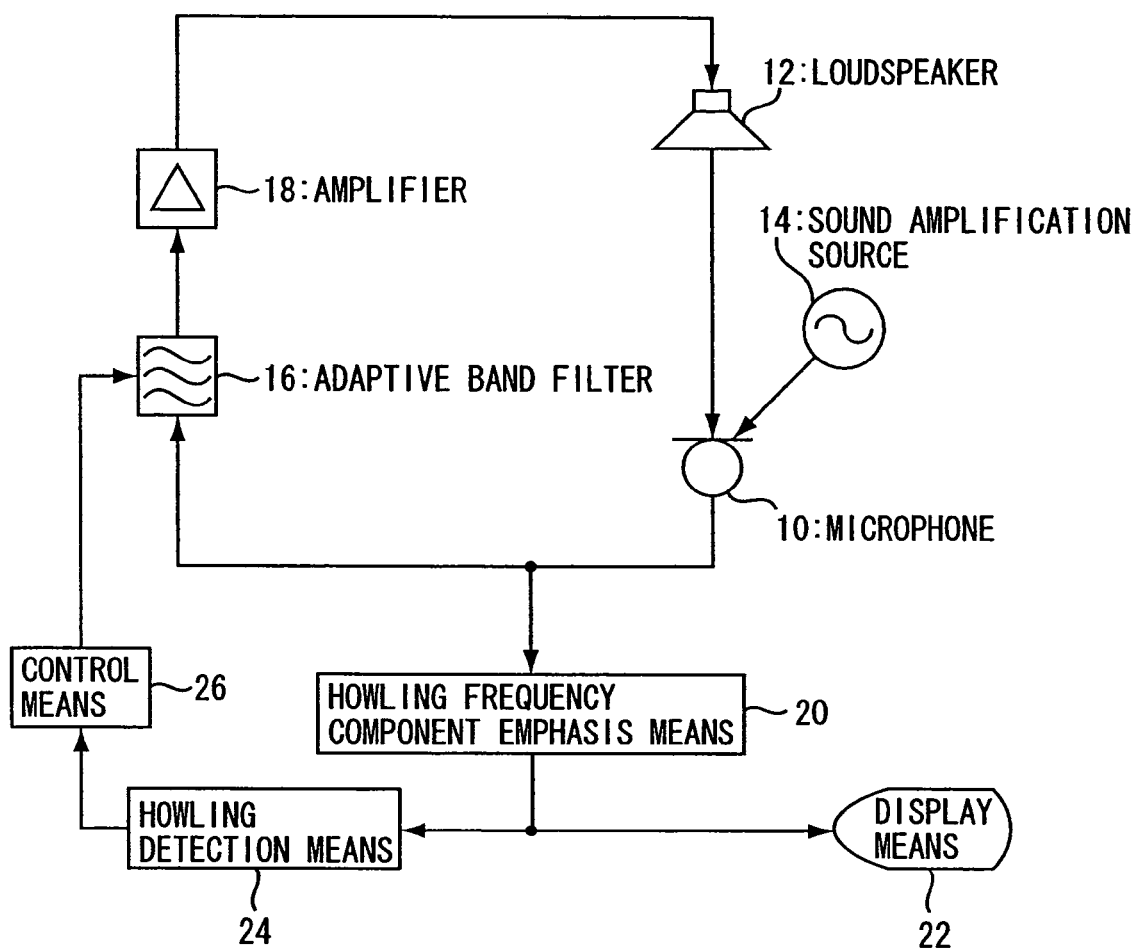
FIG. 1 is a block diagram showing an embodiment of a howling suppressor according to the present invention.

An embodiment of the present invention will be described below. FIG. 1 shows an embodiment of a howling suppressor according to the present invention. A microphone (hereafter referred to as a "mike") 10 and a loudspeaker (hereafter referred to as a "speaker") 12 are disposed in the same space such as a hall. The mike 10 picks up a sound generated from a sound amplification source (such as an musical instrument, a singer, and a narrator) 14. The sound picked up by the mike 10 is input to an adaptive band filter 16. The adaptive band filter 16 comprises a notch filter and the like having the continuously variable center frequency and suppresses (attenuates or removes) a howling frequency component contained in the miked signal. The miked signal whose howling frequency component is suppressed is amplified by an amplifier 18 and is uttered from the speaker 12. The sound uttered from the speaker 12 is partly fed back to the mike 10 and is re-picked up.

A howling frequency component emphasis means 20 applies frequency analysis to a miked signal and emphasizes a howling frequency component. Display means 22 comprises an image display apparatus such as a liquid crystal display and displays the frequency characteristic with the emphasized howling frequency component, the frequency itself, or its level. The display of the frequency characteristic is chronologically updated. Alternatively, the time change characteristic of the frequency characteristic is displayed three-dimensionally. This display makes it possible to observe the presence or absence of howling and the growth of howling frequency components. The howling detection means 24 detects the presence or absence of howling, a howling frequency, a howling frequency component level, and the like based on the frequency characteristic with the emphasized howling frequency component. The control means 26 automatically adjusts the center frequency of the adaptive band filter 16 to the detected howling frequency based on the howling detection from the howling detection means 24. This suppresses howling frequency components contained in the miked signal to suppress the howling.

Figure 2:
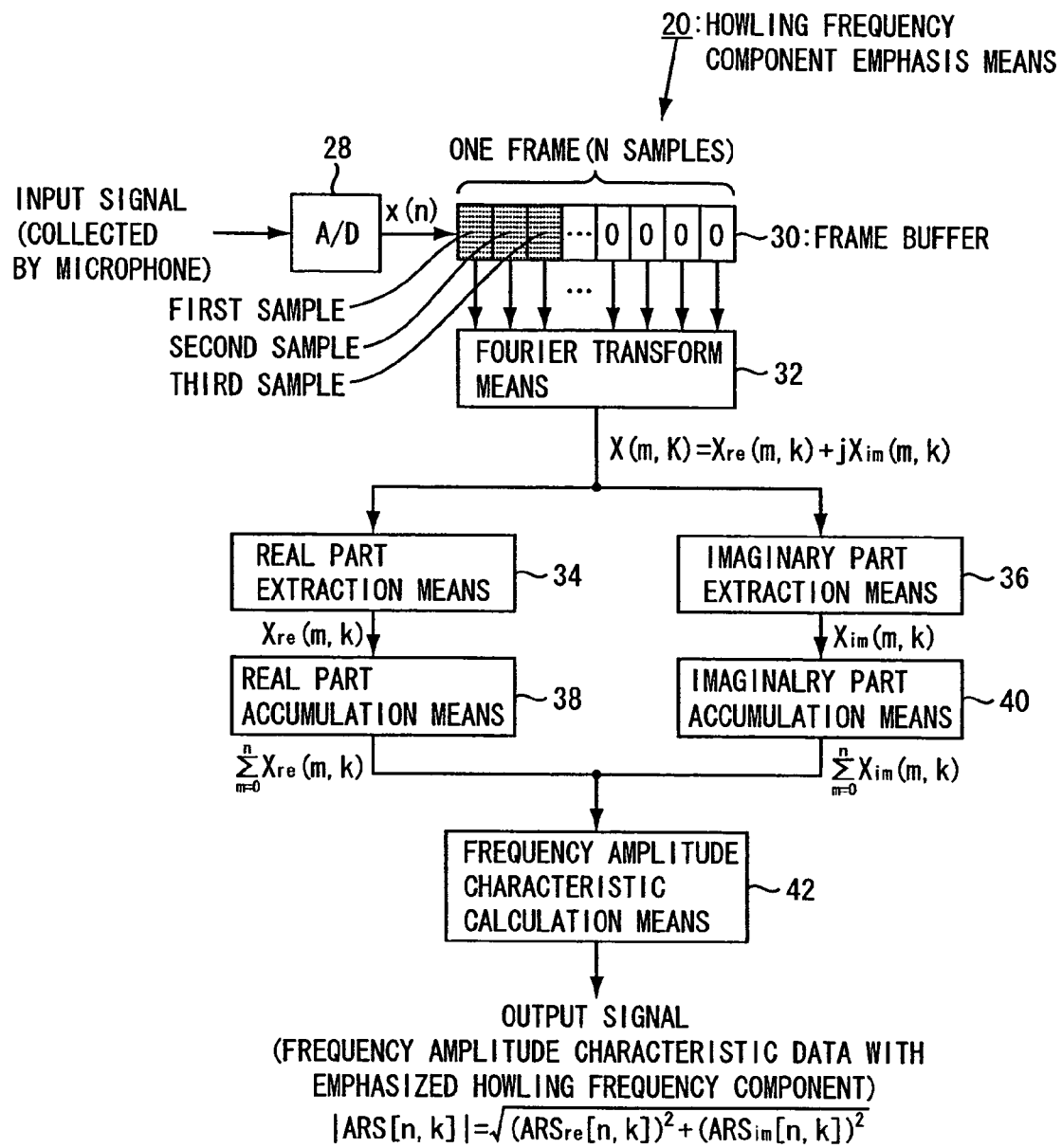
FIG. 2 is a block diagram exemplifying the configuration of a howling frequency component emphasis means shown in FIG. 1.

FIG. 2 exemplifies the configuration of the howling frequency component emphasis means 20. An A/D converter 28 converts an input signal (miked signal) into digital data at a specified sampling frequency. The A/D converter 28 outputs sample data that is sequentially stored in a frame buffer 30 (memory). The frame buffer 30 has an area to store one frame (N samples) of sample data constituting an observation period. When initially reset, the frame buffer 30 contains data values 0s in all storage areas. When sample data is input thereafter, the corresponding areas are rewritten accordingly. In the frame buffer 30, the stored sample data is read from an area that already stores the sample. Data value 0 is read from an area that stores no sample. The frame buffer 30 is reset every one frame (N samples). Thereafter, the above-mentioned storage operation is repeated.

Fourier transform means 32 Fourier transforms one frame of (N samples) data stored in the frame buffer 30 at a sampling cycle or a cycle capable of practically effective frequency analysis. Assuming that input sample data is x(n), Fourier transform X(m,k) of x(n) is expressed by equation (5) as follows.

$$X(m, k) = \sum_{i=0}^{m} x(1) e^{-j\frac{2\pi}{N}ik} = X_{re}(m, k) + jX_{im}(m, k) \quad (5)$$

where Xre(m,k) is real part data for X(m,k);
Xim(m,k) imaginary part data for X(m,k); and
j the imaginary unit.

Real part extraction means 34 extracts real part data Xre (m,k) Fourier-transformed data X(m,k) at the sampling cycle. Imaginary part extraction means 36 extracts imaginary part data Xim(m,k) Fourier-transformed data X(m,k) at the sampling cycle.

Accumulation means 38 and 40 accumulate Fourier transform results at the sampling cycle. That is, on the whole, the accumulation means 38 and 40 find principally find accumulated value ARS [n,k] as a result of the Fourier transform using equation (6).

$$ARS[n, k] = \sum_{m=0}^{n} w(m, n) x(m) e^{-j\frac{2\pi}{N}mk} \quad (6)$$

The initial condition is:

$ARS[n,k]=0 \ (n<0)$

When there is no input data, the ARS value is set to 0 (zero-cleared). Another condition is:

$w(m,n)=(n-m+1)$

This means the above-mentioned triangular window function.

Specifically, the accumulation means 38 and 40 perform accumulation for each real part and imaginary part in Fourier transform results. That is, the real part accumulation means 38 accumulates real part data Xre(m,k) with reference to the frequency axis at the sampling cycle to find the following.

$$\sum_{m=0}^{n} X_{re}(m, k)$$

The imaginary part accumulation means 40 accumulates imaginary part data Xim(m,k) with reference to the frequency axis at the sampling cycle to find the following.

$$\sum_{m=0}^{n} X_{im}(m, k)$$

Frequency amplitude characteristic calculation means 42 finds accumulated value ARS [n,k] for Fourier transform results using equation (7) at the specified sampling cycle based on the accumulated real part data and imaginary part data.

$$ARS[n, k] = \sum_{m=0}^{n} X(m, k) \quad (7)$$
$$= \sum_{m=0}^{n} X_{re}(m, k) + j \sum_{m=0}^{n} X_{im}(m, k)$$
$$= ARS_{re}[n, k] + jARS_{im}[n, k]$$

The initial condition is:

$ARS[n,k]=0 \ (n<0)$

When there is no input data, the ARS value is set to 0 (zero-cleared). Further, the frequency amplitude characteristic calculation means 42 finds an absolute value for ARS using equation (8). The ARS' absolute value becomes an output signal from the howling frequency component emphasis means 20.

$$|ARS[n,k]| = \sqrt{(ARS_{re}[n,k])^2 + (ARS_{im}[n,k])^2} \quad (8)$$

The display means 22 (FIG. 1) sequentially displays frequency amplitude characteristics that are found at the specified sampling cycle and contain emphasized howling components. Using this display, a user can observe the presence or absence of howling, a howling frequency, the growth of howling frequency components. The howling detection means 24 (FIG. 1) detects the presence or absence of howling occurrence, a howling frequency, and a howling frequency component level based on frequency amplitude characteristics found at the specified sampling cycle.

Figure 3:
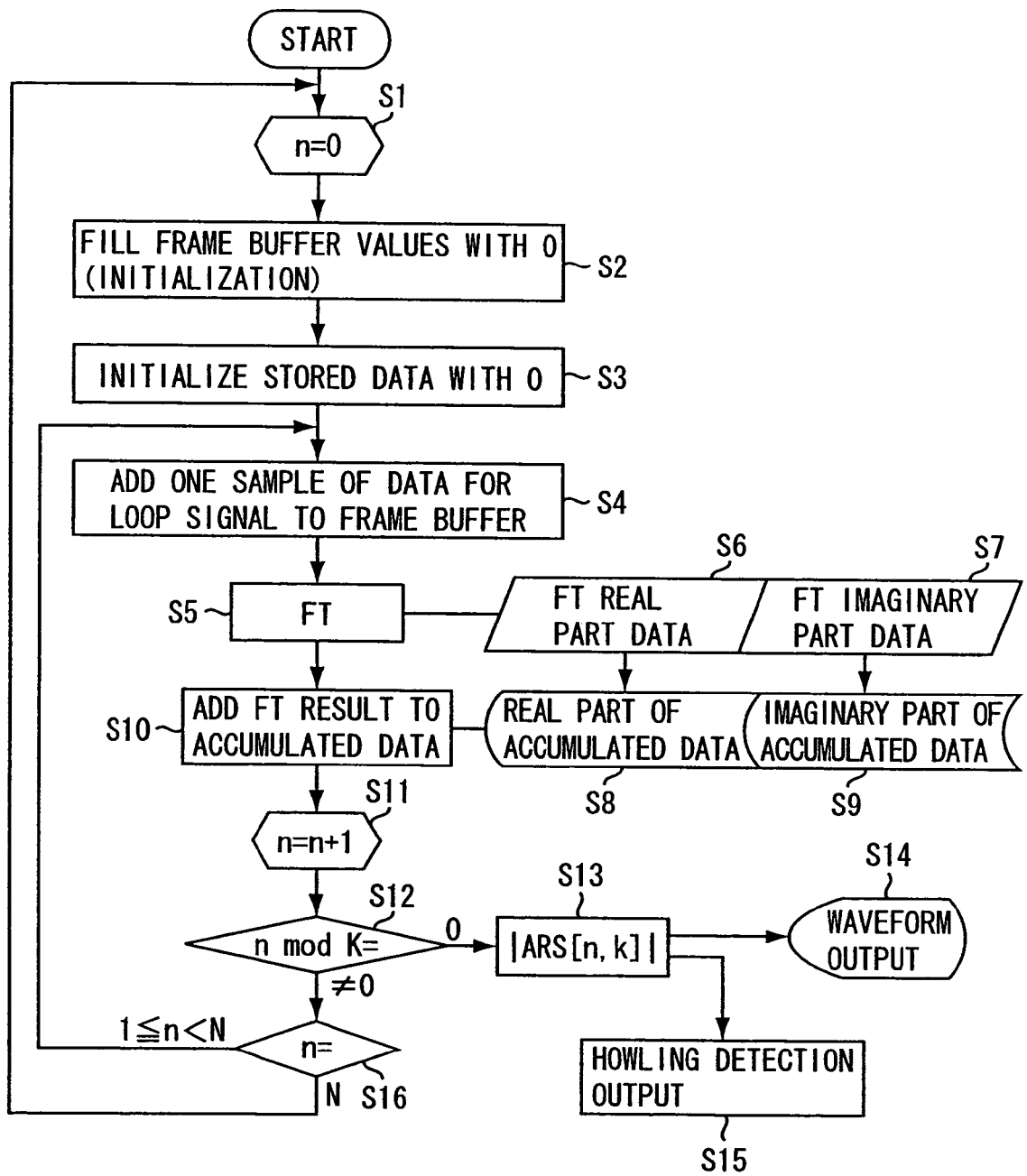
FIG. 3 is a flowchart showing a signal process of the howling frequency component emphasis means shown in FIG. 1.
Figure 4:
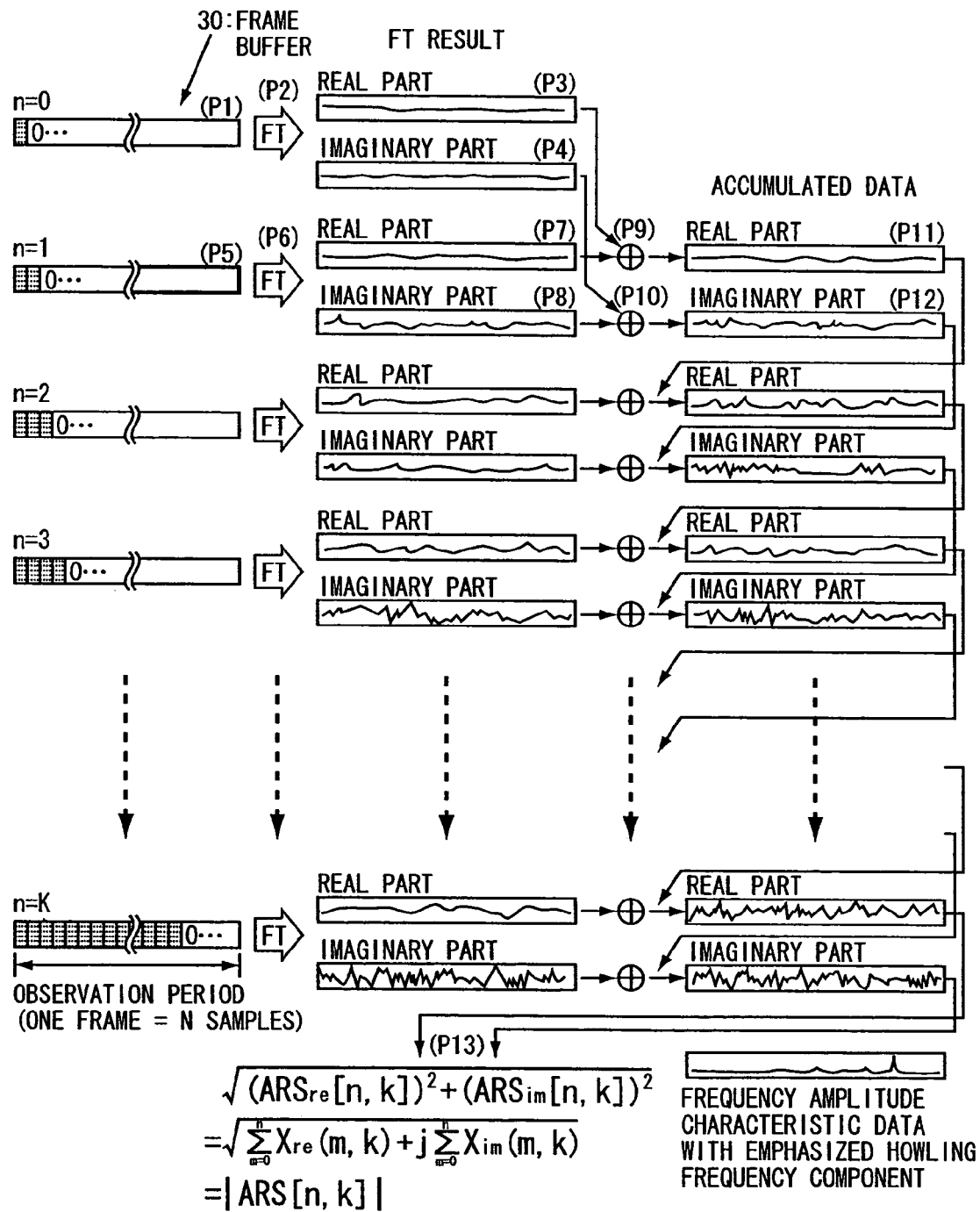
FIG. 4 is a pattern diagram showing operations according to the signal process shown in FIG. 3.

Referring now to FIGS. 3 and 4, the following describes signal processes in the howling frequency component emphasis means 20. When an instruction is given to start the observation of a miked signal, the process resets a counter for counting the number of samples n to 0 (step S1 in FIG. 3). Data value 0 is embedded in all storage areas of the frame buffer 30 equivalent to one frame (N samples) (S2). Accumulated values in the accumulation means 38 and 40 are reset to 0 (S3). When the first sample data is input in this state, the sample data is stored in the first storage area of the frame buffer 30 (S4, process P1 in FIG. 4). As a result, data in the first storage area is updated from the initial data value 0 to the value of the first sample data.

When the first sample data is stored in the frame buffer 30, the Fourier transform means 32 Fourier-transforms all N-samples of data (all data values set to 0s except the first sample data) stored in the frame buffer 30 (S5, P2). The real part extraction means 34 extracts real part data from the Fourier-transformed data (S6, P3). The imaginary part extraction means 36 extracts imaginary part data from the Fourier-transformed data (S7, P4). The extracted real part data is stored in the real part accumulation means 38 (S8). The extracted imaginary part data is stored in the imaginary part accumulation means 40 (S9). In this manner, the process at the first sampling cycle terminates. The counter to count the number of samples is incremented by 1 to be set to "1" (S11).

When the second sample data is input, the sample data is stored in the second storage area of the frame buffer 30 (S4, P5.) As a result, data in the second storage area is updated from the initial data value 0 to the value of the second sample data. When the second sample data is stored in the frame buffer 30, the Fourier transform means 32 Fourier-transforms all N-samples of data (all data values set to 0s except the first and second sample data) stored in the frame buffer 30 (S5, P6). The real part extraction means 34 extracts real part data from the Fourier-transformed data (S6, P7). The imaginary part extraction means 36 extracts imaginary part data from the Fourier-transformed data (S7, P8). The extracted real part data is accumulated with the first real part data stored in the real part accumulation means 38 (S10, P9). The extracted imaginary part data is accumulated with the first imaginary part data stored in the imaginary part accumulation means 40 (S10, P10). Data in the real part accumulation means 38 is updated to the accumulated real part data (S8, P11). Data in the imaginary part accumulation means 40 is updated to the accumulated imaginary part data (S9, P12). In this manner, the process at the second sampling cycle terminates. The counter to count the number of samples is incremented by 1 to be set to "2" (S11).

The above-mentioned operations are repeated at the sampling cycle. Based on the accumulated real part data and imaginary part data, the frequency amplitude characteristic calculation means 42 uses the above-mentioned equation (8) to find absolute value |ARS(n,k)| for the frequency amplitude characteristic. This calculation is performed each time the MOD function (S12) becomes:

n mod K=0 where n is the number of samples and K is the divisor for the number of all samples N in the frame buffer 30. This means that the number of samples n is divided by the preset value K to yield the remainder 0, i.e., the number of samples n becomes a multiple of the preset value K. The found frequency amplitude characteristic is displayed on the display means 22 (S14). The found frequency amplitude characteristic is transmitted to the howling detection means 24 (FIG. 1) for howling detection (S15). When the number of samples n reaches the number of all samples N in the frame buffer 30 (S16), the number of samples is reset to the initial value (S1 through S3). The above-mentioned process is repeated from the first sample data in the next frame.

Figure 5:
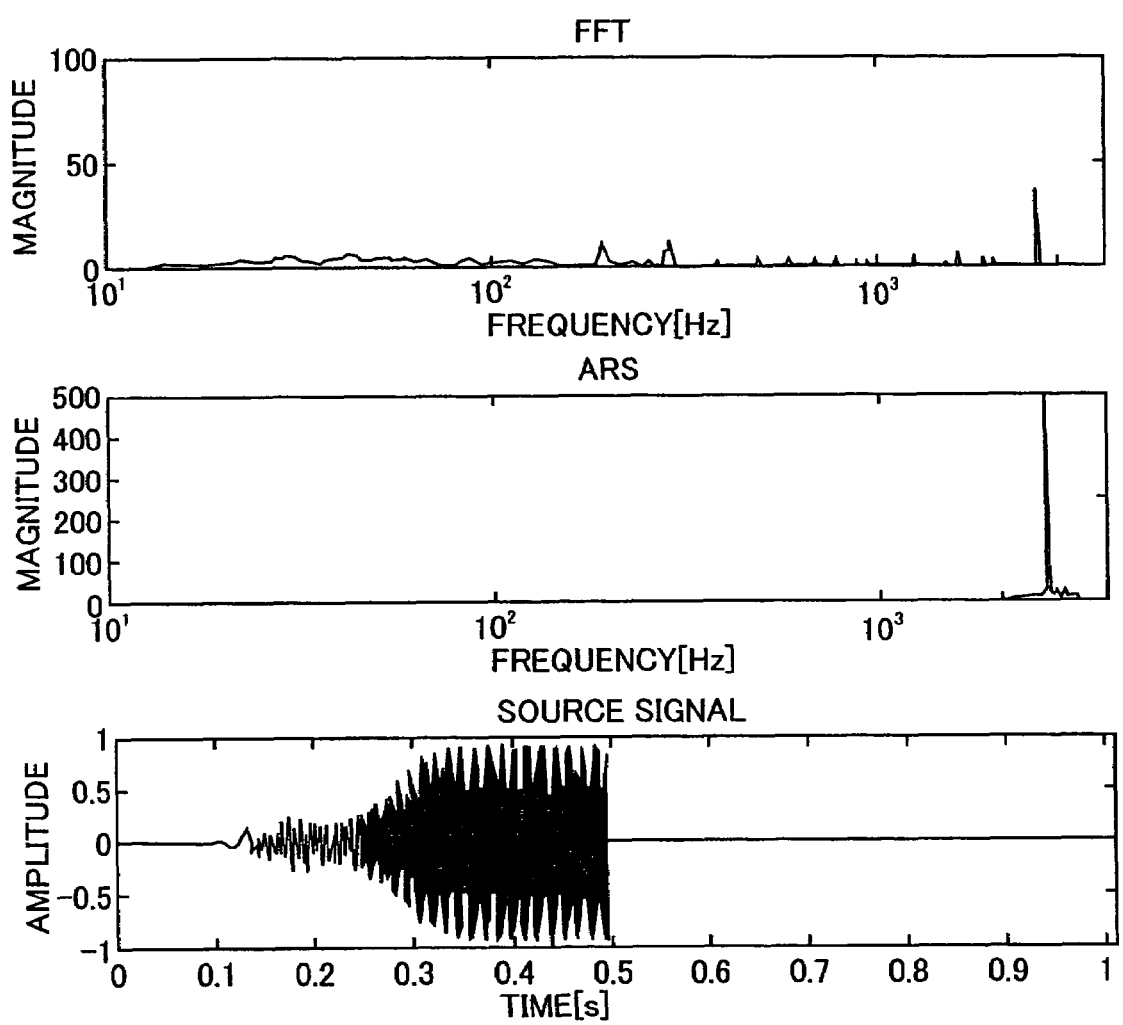
FIG. 5 is frequency characteristic diagrams and a waveform diagram showing simulation results of a howling frequency component emphasis process according to embodiment 1.

FIG. 5 shows results of simulating the howling frequency component emphasis process according to the above-mentioned embodiment 1. Simulation conditions follow. An input signal has sampling frequency Fs set to 8 kHz. One-frame length N is equivalent to 1000 samples. The display means 22 displays the accumulated value's frequency amplitude characteristic in units of K=100 samples. In FIG. 5, the top shows absolute value |X(m,k)| of the Fourier transform (output from the Fourier transform means 32) at a specified time. The middle shows absolute value |ARS[n,k]| of the ARS (output from the frequency amplitude characteristic calculation means 42) at the same time. The bottom shows input signal x(n). According to FIG. 5, the Fourier transform's absolute value |x(m,k)| allows the observation of not only a howling frequency' peak, but also the other peaks than the howling. By contrast, the ARS clearly emphasizes the howling frequency as a peak.

The following describes a signal analysis window function. The more outdated data in the frame buffer 30 preserves the earlier information. Input signal components incorporated into the frame buffer 30 contain a loop signal component that is once output from the speaker 12 and then returns to the mike 10. The loop signal component includes loop transfer characteristic, i.e., an impulse response. The howling occurs depending on the system's transfer characteristic (impulse response). More transfer characteristic information is contained in an earlier portion of the impulse response waveform along the time axis. For this reason, weighting is provided by giving a larger weight to earlier data in the input signal components incorporated into the frame buffer 30. This can emphasize the transfer characteristic and therefore the howling growth. For example, an inverse index window function can be used as the signal analysis window function.

Figure 6:
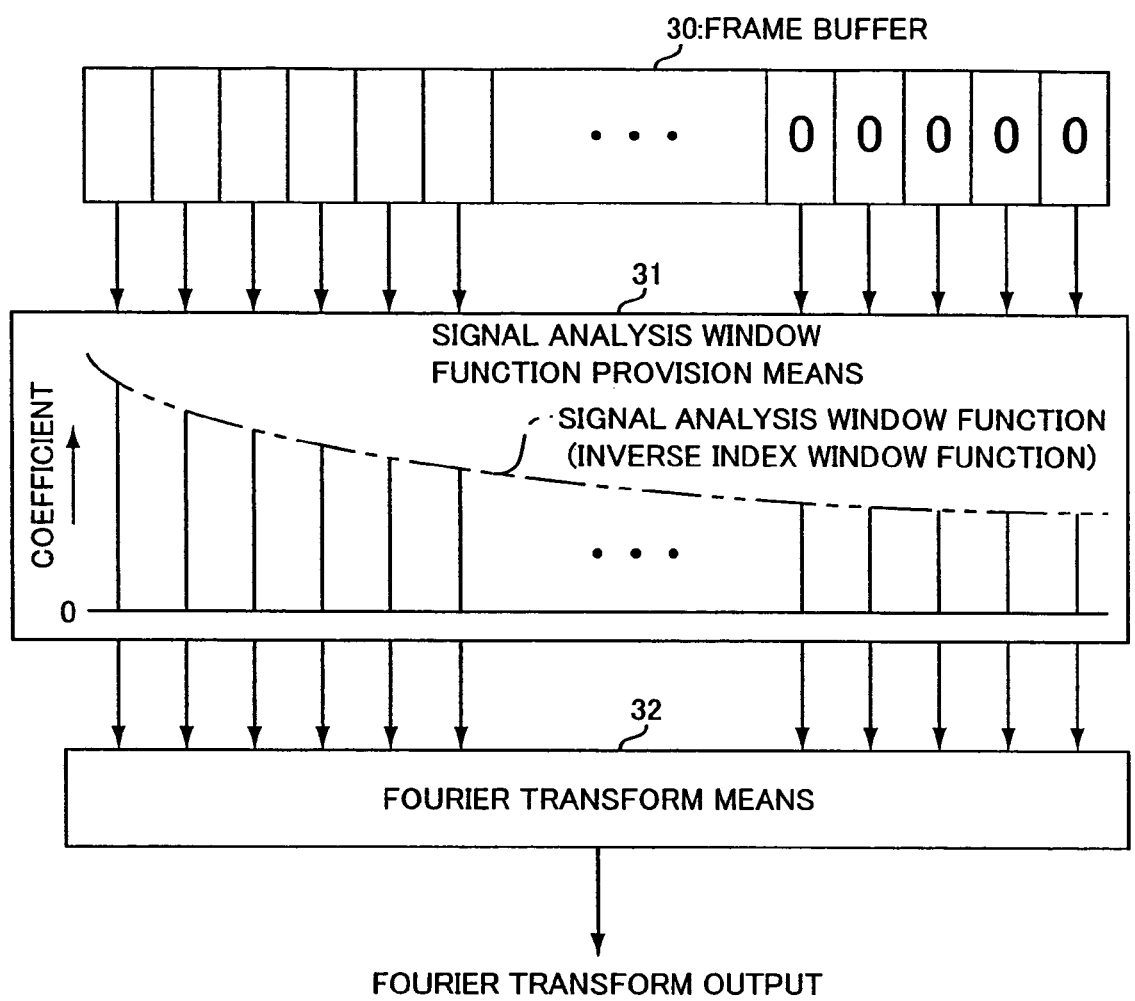
FIG. 6 is a block diagram showing the technique of applying a weight coefficient according to embodiment 1.

With reference to FIG. 6, the following describes a technique of applying the signal analysis window function. In the frame buffer 30, as mentioned above, the stored sample data is read at the sampling cycle from an area that already stores samples. The sample data is equivalent to one frame (N samples). Data value 0 is read from an area where no sample is stored yet. A given signal analysis window function is assigned to signal analysis window function provision means 31. Each sample data read from the frame buffer 30 is provided with a coefficient (weight) that is individually determined by the window function. FIG. 6 shows a case of using an inverse index window function as the signal analysis window function. The earlier sample data is provided with a larger coefficient value. The use of the inverse index window function can especially emphasize transmission characteristics. The Fourier transform means 32 Fourier-transforms one frame (N samples) of sample data that is provided with the coefficient by the signal analysis window function provision means 31 at the sampling cycle or a cycle capable of practically effective frequency analysis. The signal analysis window function used for the signal analysis window function provision means 31 can adopt not only the inverse index window function, but also any other appropriate functions according to frequency bands to be emphasized.

The above-mentioned method calculates the frequency characteristic of sample data stored in the frame buffer 30 at each sampling cycle (i.e., each time one new sample data is observed). Further, it is possible to calculate the frequency characteristic at a plurality of sampling cycles (i.e., at discontinuous timings when a plurality of new sample data is observed).

In a specific case, the observation signal itself is used as the signal analysis window function. In such a case, the signal analysis window function application means is provided with a window function buffer having the same structure as the frame buffer 30. The input signal is successively stored in the window function buffer while the same input signal is successively stored in the frame buffer 30. The input signal stored in the window function buffer is applied as the window function to the same input signal stored in the frame buffer 30. Alternatively, the signal analysis window function application means may directly computes a square of each sample of the input signal stored in the frame buffer 30.

Figure 9:
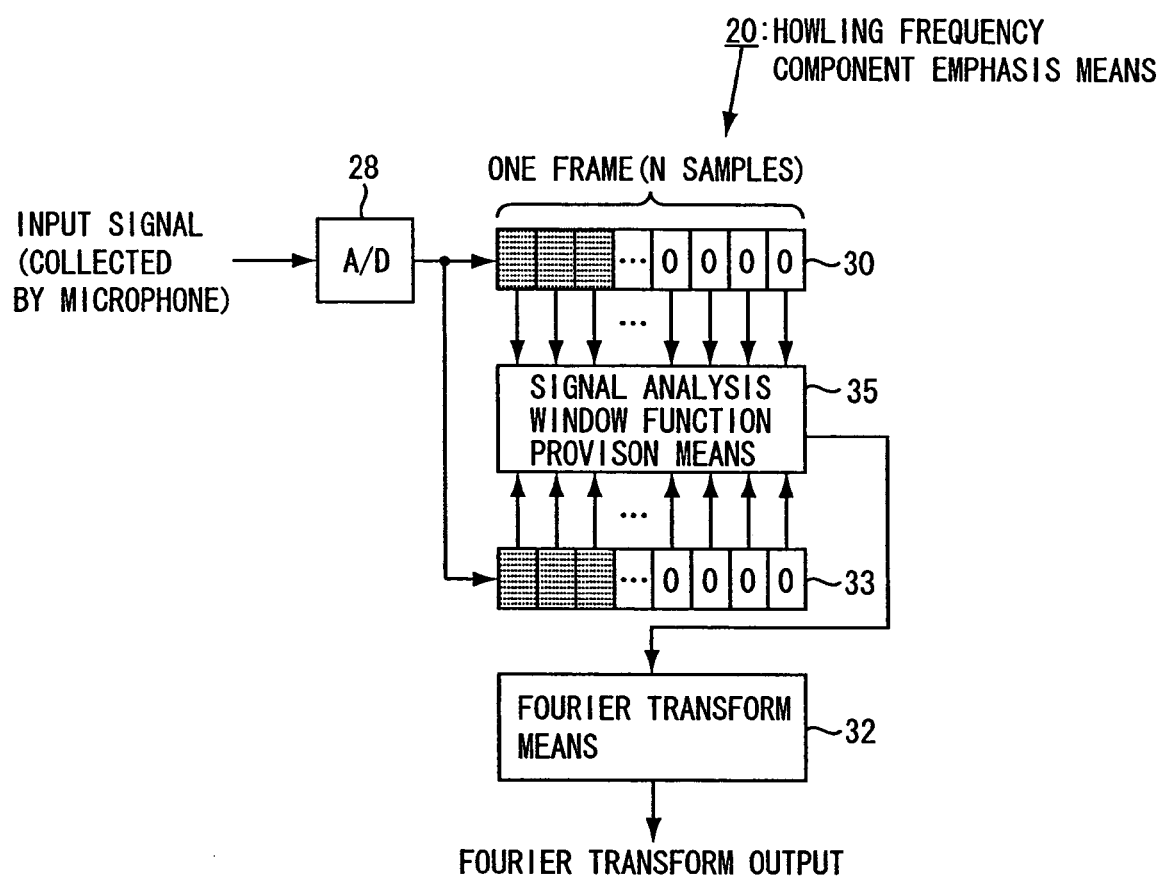
FIG. 9 is a block diagram showing another technique of applying a weight coefficient to embodiment 1.

In one form as shown in FIG. 9, a frame buffer 30 is accessed to read therefrom one frame of sample data (N samples) at each sampling period as described before. The read set of sample data contains actually sampled data stored in the frame buffer 30 and zero data read from a vacant area of the frame buffer 30. A window function buffer 33 stores the same sample data as the frame buffer 30, and is accessed to read therefrom the set of the sample data which are identical to the set of the sample data read from the frame buffer 30. A signal analysis window function provision means 35 multiplies the set of the sample data read from the frame buffer 30 and the set of the sample data read from the window function buffer 33 with each other, and outputs the multiplied results. This operation is equivalent to use the self correlation function as the window function. Consequently, this operation is equivalent to acquire the self correlation of the sample data. Therefore, phase information of the sample data is lost by this operation, but the frequency spectrum components are emphasized to signify frequency components having a potential of causing howling during a transitional interval from a stable state to occurrence of howling. Stated otherwise, coloration state is emphasized during the transition period, thereby facilitating monitor of the frequency components having the potential of growing the howling. A fourier transform means 32 operates each sampling period or other period effective to provide practical frequency analysis for fourier-transforming one frame of the sample data (N samples) which are applied with coefficients by the signal analysis window function provision means 35.

Figure 10:
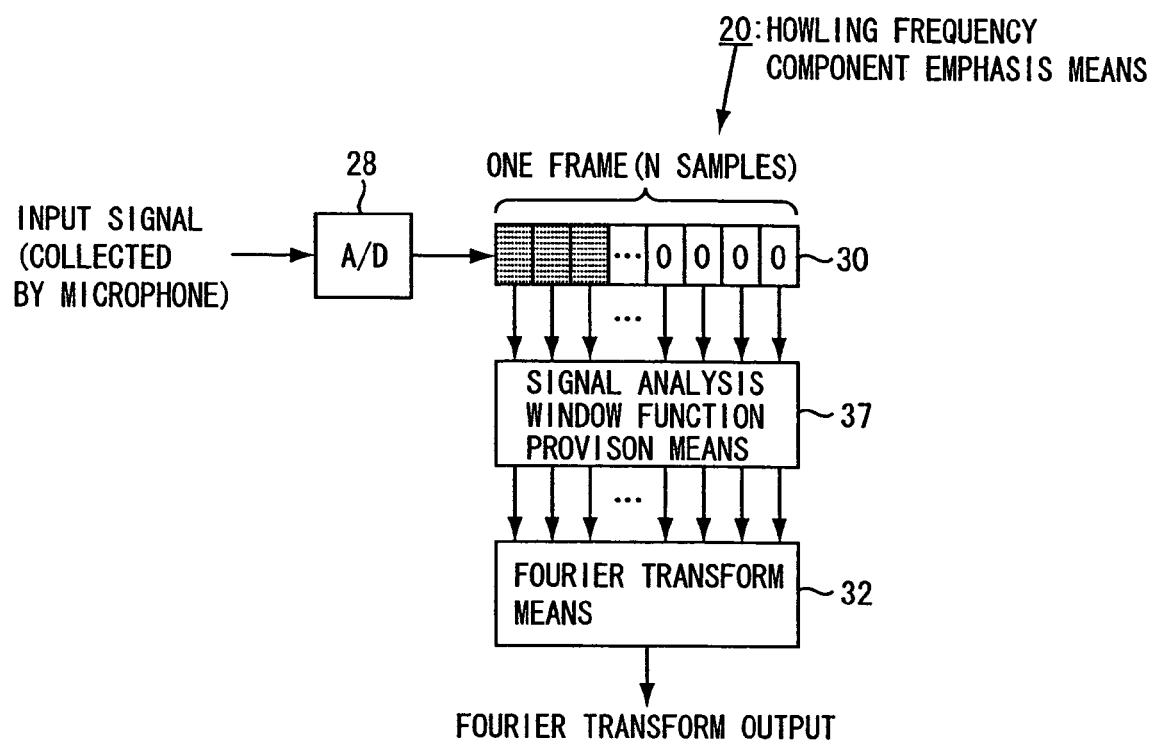
FIG. 10 is a block diagram showing a still another technique of applying a weight coefficient to embodiment 1.

In another form as shown in FIG. 10, a frame buffer 30 is accessed to read therefrom one frame of sample data (N samples) at each sampling period as described before. The read set of sample data contains actually sampled data stored in the frame buffer 30 and zero data read from a vacant area of the frame buffer 30. A signal analysis window function provision means 37 computes a square value of each sample of the running set read from the frame buffer 30. This operation is equivalent to use the self correlation function as the window function likewise the embodiment shown if FIG. 9. Consequently, this operation is equivalent to acquire the self correlation of the sample data. Therefore, phase information of the sample data is lost by this operation, but the frequency spectrum components are emphasized to signify frequency components having a potential of causing howling during a transitional interval from a stable state to occurrence of howling. Stated otherwise, coloration state is emphasized during the transition period, thereby facilitating monitor of the frequency components having the potential of growing the howling. A fourier transform means 32 operates each sampling period or other period effective to provide practical frequency analysis for fourier-transforming one frame of the sample data (N samples) which are applied with coefficients by the signal analysis window function provision means 37.

As described above, the sampling process pre-weights each sample of the sound signal successively sampled during the observation period by using a signal analysis window function which is provided to cover the predetermined length of the observation period, so that the running set of the samples is composed of the pre-weighted samples. In a case, the sampling step uses an inverse index window function as the signal analysis window function, such that early samples in the observation period is pre-weighted greater than recent samples in the same observation period. In another case, the sampling step uses the samples of the sound signal as the signal analysis window function for pre-weighting the samples, so that each pre-weighted sample is provided in the form of a square of each sample.

Embodiment 2

Figure 7:
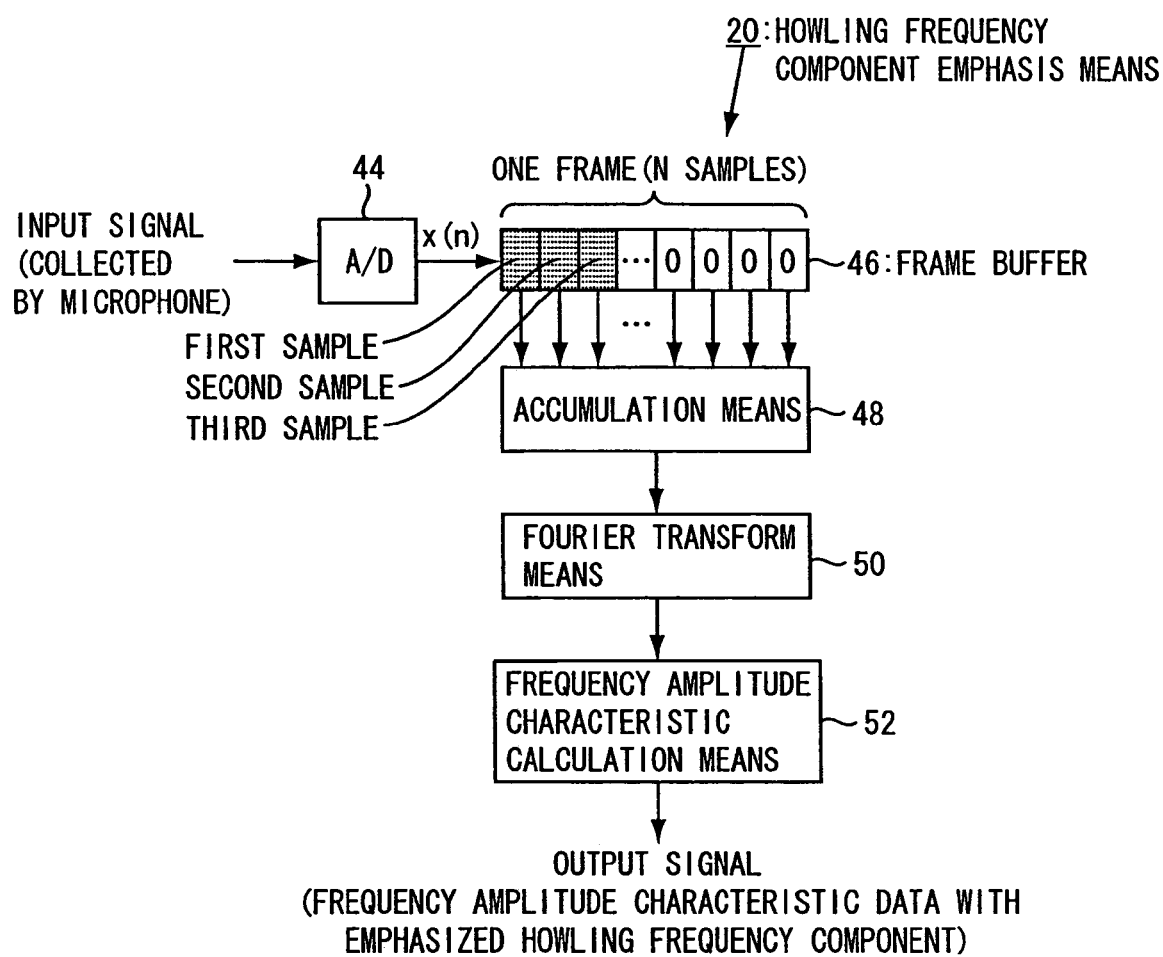
FIG. 7 is a block diagram showing another configuration of the howling frequency component emphasis means shown in FIG. 1.

FIG. 7 exemplifies another configuration of the howling frequency component emphasis means 20 in FIG. 1. An A/D converter 44 converts an input signal (miked signal) into digital data at a specified sampling frequency. A frame buffer 46 (memory) sequentially stores sample data output from the A/D converter 44. The frame buffer 46 has an area to store one frame (N samples) of sample data constituting an observation period. When initially reset, the frame buffer 46 contains data values 0s in all storage areas. When sample data is input thereafter, the corresponding areas are rewritten accordingly. In the frame buffer 46, the stored sample data is read from an area that already stores the sample. Data value 0 is read from an area that stores no sample. The frame buffer 46 is reset every one frame (N samples). Thereafter, the above-mentioned storage operation is repeated.

Accumulation means 48 accumulates sample data stored in the frame buffer 46 with each other with reference to the time axis at the sampling cycle. Fourier transform means 50 Fourier-transforms accumulated values from the accumulation means 48 each time the number of samples n reaches preset value K. Frequency amplitude characteristic calculation means 52 calculates a frequency amplitude characteristic from the Fourier transformed value each time the Fourier transform is performed. The calculated amplitude frequency characteristic is transmitted to the display means 22 and the detection means 24 in FIG. 1.

The above-mentioned description accumulates the sample data stored in the frame buffer 46 at the sampling cycle (i.e., each time one new sample data is observed). Further, it is possible to accumulate the sample data at a plurality of sampling cycles (i.e., at discontinuous timings when a plurality of new sample data is observed).

According to the above-mentioned description, sample data stored in the frame buffer 46 is accumulated at the sampling cycle. The accumulated value is Fourier-transformed each time the number of samples n reaches the specified value. The display and the howling detection are performed based on the Fourier transform result. Further, it may be preferable to combine embodiments 1 and 2. That is, sample data stored in the frame buffer 46 can be accumulated at the sampling cycle. The accumulated value can be Fourier-transformed each time the number of samples n reaches the specified value. The display and the howling detection can be performed based on a result of accumulating the specified number of Fourier transform results.

The signal analysis window function provision means described in the above-mentioned embodiment 1 can be provided between the frame buffer 46 and the accumulation means 48 (or between the accumulation means 48 and the Fourier transform means 50). This makes it possible to provide each sample data with a coefficient (weight) according to a given signal analysis window function (e.g., inverse index window function).

Embodiment 3

Figure 8:
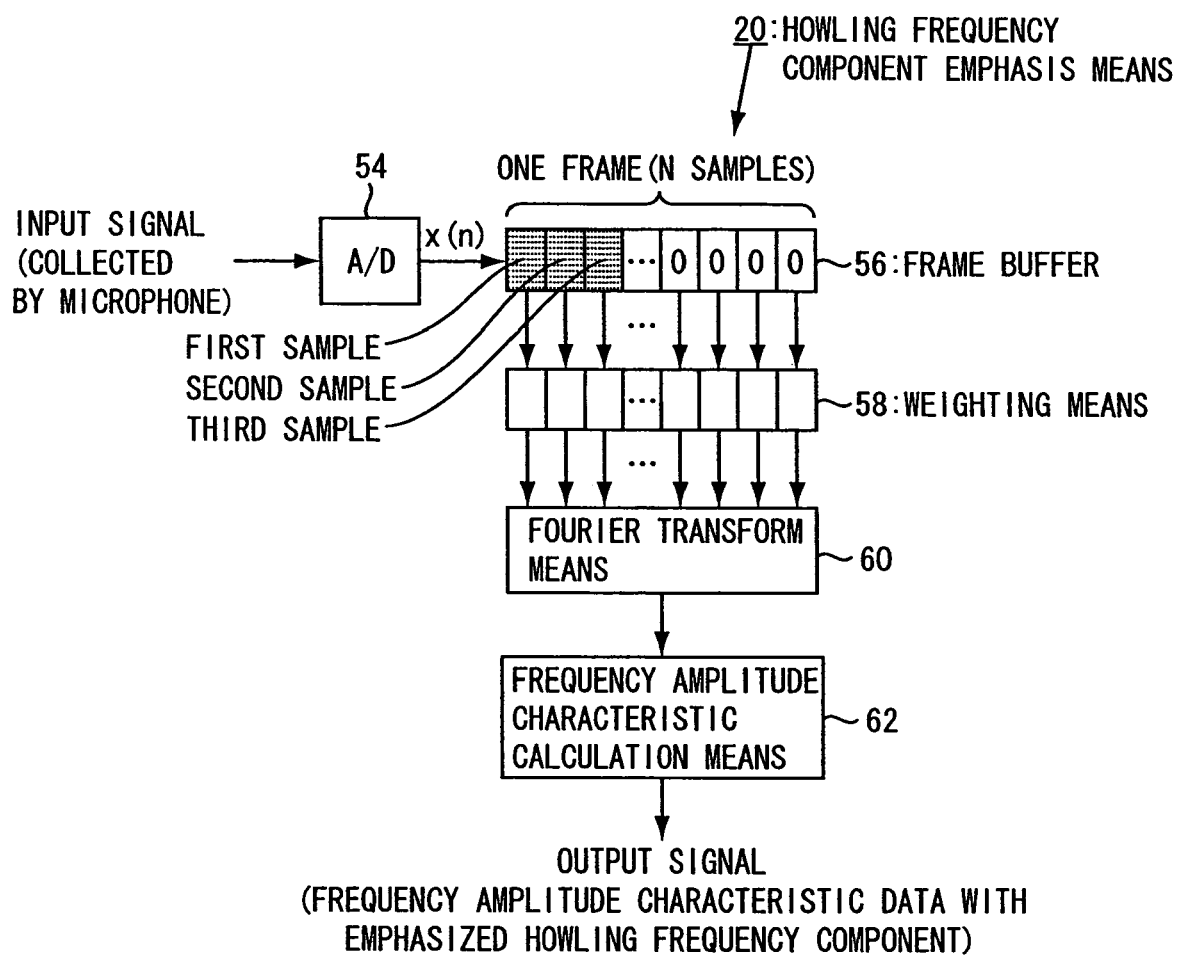
FIG. 8 is a block diagram showing yet another configuration of the howling frequency component emphasis means shown in FIG. 1.

FIG. 8 exemplifies yet another configuration of the howling frequency component emphasis means 20 in FIG. 1. An A/D converter 54 converts an input signal (miked signal) into digital data at a specified sampling frequency. A frame buffer 56 (memory) sequentially stores sample data output from the A/D converter 54. The frame buffer 56 has an area to store one frame (N samples) of sample data constituting an observation period. When initially reset, the frame buffer 56 contains data values 0s in all storage areas. When sample data is input thereafter, the corresponding areas are rewritten accordingly.

Each time the number of samples n reaches preset value K, weighting means 58 reads each sample data stored in the frame buffer 56 and chronologically weights the sample data (equivalent to providing triangular window functions). A weight value supplied to each sample data can be specified so as to be equivalent to a sampling cycle during which each sample data remains in the frame buffer 56, for example. That is, when the number of samples n first reaches preset value K, the sample data is weighted as follows.

Weight K assigned to the first sample data
Weight K−1 assigned to the second sample data
Weight K−2 assigned to the third sample data
:
Weight 1 assigned to the Kth sample data When the number of samples n reaches preset value K for the second time (the number of samples totaled to 2K) the sample data is weighted as follows.

Weight 2K assigned to the first sample data
Weight 2K−1 assigned to the second sample data
Weight 2K−2 assigned to the third sample data :
Weight K+1 assigned to the Kth sample data
Weight K assigned to the (K+1)th sample data
:
Weight 1 assigned to the 2Kth sample data Fourier transform means 60 Fourier-transforms weighted values output from the weighting means 58 each time the number of samples n reaches preset value K. Frequency amplitude characteristic calculation means 62 calculates a frequency amplitude characteristic from the Fourier transformed value each time the Fourier transform is performed. The calculated amplitude frequency characteristic is transmitted to the display means 22 and the detection means 24 in FIG. 1.

Moreover, the signal analysis window function provision means described in the above-mentioned embodiment 1 can be provided between the frame buffer 56 and the weighting means 58. This makes it possible to weight provide each sample data with a coefficient (weight) according to a given signal analysis window function (e.g., inverse index window function). The weighting means 58 and the signal analysis window function provision means can be integrated. This makes it possible to use a function composed of the triangular window function according to the weighting means 58 and the signal analysis window function according to the signal analysis window function provision means.

(Modifications)

The above-mentioned embodiments emphasize howling frequency components based on a pickup signal from the mike 10 to detect the howling. Further, it is also possible to emphasize howling frequency components to detect the howling based on signals obtained from any points in the acoustic feedback system composed of the mike 10, the speaker 12, and then mike 10.

In the disclosed embodiments, the ARS and related methods are applied to the acoustic feedback system for emphasizing and detecting a howling frequency. In this case, the growing rate of the howling frequency component is significantly accelerated as compared to normal frequency components of the sound signal, thereby quickly discriminating between the howling frequency component and other normal frequency components of the music sound signal. The inventive method may be applied not only to analysis of the sound signal of the acoustic feedback system, but also to analysis of a sound signal in a general acoustic system. For example, the inventive method is applied to emphasize and detect a peak component contained in the sound signal of the general acoustic system. This method is useful in various application fields such as speaker recognition by emphasis of formant frequency, speech recognition, detection of music pitch, and emphasis of unique vibration frequency (mode frequency) of impulse response in a given acoustic space or room.

Figure 11:
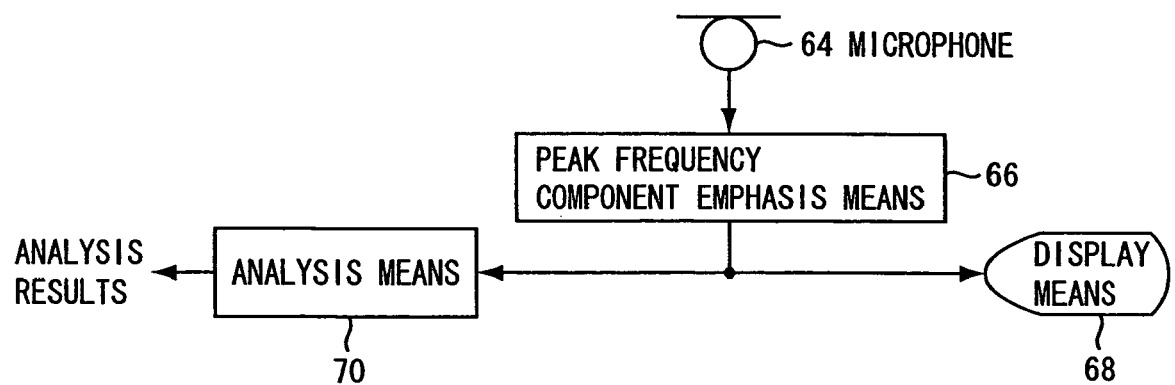
FIG. 11 is a block diagram showing an embodiment of a peak frequency component emphasis apparatus according to the invention.

FIG. 11 shows an embodiment of the peak frequency component emphasis apparatus. This apparatus is utilized in the technical field of speaker recognition and voice recognition for emphasizing formant frequency components representing resonant frequencies of a voice organ of the speaker and for emphasizing a pitch frequency representing a fundamental frequency component of a voiced sound, thereby improving the accuracy of the recognition. Further, this apparatus is utilized in the technical field of acoustic characteristic analysis for emphasizing a unique frequency (mode frequency) in an impulse response of a room to be measured. A microphone 64 collects the voice of the speaker when the apparatus is used for voice recognition or speaker identification. Otherwise, the microphone 64 is used for collecting an impulse sound when the apparatus is utilized for the acoustic characteristic analysis of an acoustic room. A peak frequency component emphasis means 66 carries out a process of emphasizing peak frequency components of the sound signal collected by the microphone 64 based on the inventive emphasis method as described before. A display means 68 is composed of an image displaying device such as CRT or liquid crystal display panel for displaying a frequency spectrum of the collected sound where the peak frequency components are visually emphasized. For the application of the voice recognition or speaker identification, an analysis means 70 carries out analysis process for the voice recognition or speaker identification. For the application of the acoustic characteristic analysis, the analysis means 70 carries out analysis process of the acoustic characteristic of a room to be measured.

The peak frequency component emphasis means 66 is constructed in manner similar to the howling frequency component emphasis means 20 shown in FIG. 2. Namely, as shown in FIG. 2, a sound signal collected by the microphone 64 is inputted into the A/D converter 28, so that the frequency amplitude characteristic calculation means 42 provides frequency characteristic amplitude data where the peak frequency components are emphasized. In this case, the peak frequency component emphasis means 66 performs the same processes as depicted in FIGS. 3 and 4. Further, in manner similar to the arrangement shown in FIGS. 6, 9 and 10, a signal analysis window function provision means 31, 35 or 37 may be arranged between the frame buffer 30 and the fourier transform means 32.

The peak frequency component emphasis means 66 may be constructed in manner similar to the howling frequency component emphasis means 20 shown in FIGS. 7 and 8. Namely, a sound signal collected by the microphone 64 is inputted into the A/D converter 44 of the FIG. 7 embodiment or the A/D converter 54 of the FIG. 8 embodiment, so that the frequency amplitude characteristic calculation means 52 of the FIG. 7 embodiment or the frequency amplitude characteristic calculation means 62 of the FIG. 8 embodiment provides frequency characteristic amplitude data where the peak frequency components are emphasized.

The present invention can be used as a technology to detect and suppress howling in a sound amplification system that disposes a mike and a speaker in a space such as a hall and uses the speaker to amplify a miked sound.

What is claimed is:

1. A method of emphasizing a peak frequency component of a sound signal inputted during an observation period having a predetermined length, the method comprising the steps of:

successively sampling the sound signal to provide a running set of samples of the sound signal inputted during the observation period such that a total number of the samples in the running set increments each time one or more of new sample is added to the running set until the total number of the samples corresponds to the predetermined length of the observation period;

recurrently calculating a running frequency characteristic of the sound signal on a common frequency axis for the observation period from the running set of the samples each time one or more of new sample is added to the running set;

accumulating the recurrently calculated running frequency characteristics on the common frequency axis so as to emphasize a peak frequency component contained in the sound signal; and outputting a frequency spectrum representing the emphasized peak frequency component based on the accumulated running frequency characteristics.

2. The method according to claim 1, wherein the sampling step successively samples the sound signal from an acoustic feedback system to provide the running set of samples of the sound signal, then the accumulating step accumulates the recurrently calculated running frequency characteristics of the running sets on the common frequency axis so as to emphasize the peak frequency component which represents a howling frequency component contained in the sound signal sampled from the acoustic feedback system, and the outputting step outputs the frequency spectrum representing the emphasized howling frequency component.

3. The method according to claim 2, further including the step of detecting an actual howling frequency from the frequency spectrum containing one or more of the emphasized howling frequency component.

4. The method according to claim 3, further including the step of controlling a filter inserted in the acoustic feedback system according to the detected howling frequency so as to reduce a gain of a frequency range of the sound signal around the detected howling frequency.

5. The method according to claim 1, further comprising the step of separating the running frequency characteristic into a real part and an imaginary part, so that the accumulating step accumulates the real part of the running frequency characteristic on the common frequency axis and accumulates the imaginary part of the running frequency characteristic on the common frequency axis independently from the real part, and then combines the accumulated real parts and the accumulated imaginary parts with each other to provide a composite frequency characteristic which is equivalent to the accumulated running frequency characteristics.

6. The method according to claim 1, wherein the sampling step pre-weights each sample of the sound signal successively sampled during the observation period by using a signal analysis window function which is provided to cover the predetermined length of the observation period, so that the running set is composed of the pre-weighted samples.

7. The method according to claim 6, wherein the sampling step uses an inverse index window function as the signal analysis window function, such that early samples in the observation period is pre-weighted greater than recent samples in the same observation period.

8. The method according to claim 6, wherein the sampling step uses the samples of the sound signal as the signal analysis window function for pre-weighting the samples, so that each pre-weighted sample is provided in the form of a square of each sample.

9. The method according to claim 1, wherein the sampling step includes adding a number of zeros corresponding to a number of absent samples not yet acquired from the sound signal, to the running set of present samples already acquired from the sound signal so as to form an extended running set which has a fixed length corresponding to the predetermined length of the observation period and which contains both of the present samples and the absent samples in the form of zeros.

10. The method according to claim 1, wherein the outputting step is executed to produce the frequency spectrum every time the total number of the samples in the running set increases by a predetermined number within the observation period.

11. The method according to claim 1, wherein the sampling step finishes the sampling of the sound signal in a current observation period when the total number of the samples corresponds to the predetermined length of the observation period and restarts the sampling of the sound signal in a next observation period.

12. A method of emphasizing a howling frequency component of a sound signal observed in an acoustic feedback system during an observation period having a predetermined length, the method comprising the steps of:
    successively sampling the sound signal from the acoustic feedback system to provide a running set of samples of the sound signal arranged on a common time axis such that a total number of the samples in the running set increments each time one or more of new sample is added to the running set until the total number of the samples corresponds to the predetermined length of the observation period;
    accumulating the running set of the samples on the common time axis each time one or more of new sample is added to the running set so as to emphasize a howling frequency component contained in the sound signal;
    calculating a frequency characteristic of the accumulated running sets of the samples; and
    outputting a frequency spectrum presenting the emphasized howling frequency component based on the calculated frequency characteristic.

13. The method according to claim 12, wherein the sampling step pre-weights each sample of the sound signal successively sampled during the observation period by using a signal analysis window function which is provided to cover the predetermined length of the observation period, so that the running set is composed of the pre-weighted samples.

14. The method according to claim 13, wherein the sampling step uses an inverse index window function as the signal analysis window function, such that early samples in the observation period is pre-weighted greater than recent samples in the same observation period.

15. The method according to claim 13, wherein the sampling step uses the samples of the sound signal as the signal analysis window function for pre-weighting the samples, so that each pre-weighted sample is provided in the form of a square of each sample.

16. The method according to claim 12, wherein the sampling step includes adding a number of zeros corresponding to a number of absent samples not yet acquired from the sound signal, to the running set of present samples already acquired from the sound signal so as to form an extended running set which has a fixed length corresponding to the predetermined length of the observation period and which contains both of the present samples and the absent samples in the form of zeros.

17. The method according to claim 12, wherein the outputting step is executed to produce the frequency spectrum every time the total number of the samples in the running set increases by a predetermined number within the observation period.

18. The method according to claim 12, wherein the sampling step finishes the sampling of the sound signal in a current observation period when the total number of the samples corresponds to the predetermined length of the observation period and restarts the sampling of the sound signal in a next observation period.

19. The method according to claim 12, further including the step of detecting an actual howling frequency from the frequency spectrum containing one or more of the emphasized howling frequency component.

20. The method according to claim 19, further including the step of controlling a filter inserted in the acoustic feedback system according to the detected howling frequency so as to reduce a gain of a frequency range of the sound signal around the detected howling frequency.

21. A method of emphasizing a howling frequency component of a sound signal observed in an acoustic feedback system during an observation period having a predetermined length, the method comprising the steps of:
  successively sampling the sound signal from the acoustic feedback system to provide a running set of samples of the sound signal arranged on a common time axis in the order from early samples to recent samples so that a total number of the samples in the running set increments each time one or more of new sample is added after the recent samples of the running set until the total number of the samples corresponds to the predetermined length of the observation period;
  recurrently weighting each sample contained in the running set using a triangular function each time one or more of new sample is added to the running set such that the early samples are weighted greater than the recent samples so as to emphasize a howling frequency component of the sound signal;
  calculating a frequency characteristic of the sound signal for the observation period based on the running sets each containing the recurrently weighted samples; and
  outputting a frequency spectrum presenting the emphasized howling frequency component based on the calculated frequency characteristic.

22. The method according to claim 21, wherein the sampling step pre-weights each sample of the sound signal successively sampled during the observation period by using a signal analysis window function which is provided to cover the predetermined length of the observation period, so that the running set is composed of the pre-weighted samples.

23. The method according to claim 22, wherein the sampling step uses an inverse index window function as the signal analysis window function, such that early samples in the observation period is pre-weighted greater than recent samples in the same observation period.

24. The method according to claim 22, wherein the sampling step uses the samples of the sound signal as the signal analysis window function for pre-weighting the samples, so that each pre-weighted sample is provided in the form of a square of each sample.

25. The method according to claim 21, wherein the sampling step includes adding a number of zeros corresponding to a number of absent samples not yet acquired from the sound signal, to the running set of present samples already acquired from the sound signal so as to form an extended running set which has a fixed length corresponding to the predetermined length of the observation period and which contains both of the present samples and the absent samples in the form of zeros.

26. The method according to claim 21, wherein the outputting step is executed to produce the frequency spectrum every time the total number of the samples in the running set increases by a predetermined number within the observation period.

27. The method according to claim 21, wherein the sampling step finishes the sampling of the sound signal in a current observation period when the total number of the samples corresponds to the predetermined length of the observation period and restarts the sampling of the sound signal in a next observation period.

28. The method according to claim 21, further including the step of detecting an actual howling frequency from the frequency spectrum containing one or more of the emphasized howling frequency component.

29. The method according to claim 28, further including the step of controlling a filter inserted in the acoustic feedback system according to the detected howling frequency so as to reduce a gain of a frequency range of the sound signal around the detected howling frequency.

30. An apparatus capable of emphasizing a howling frequency component of a sound signal observed in an acoustic feedback system during an observation period having a predetermined length, the apparatus comprising:
  a sampling section that is provided with a memory and that successively samples the sound signal from the acoustic feedback system and sequentially writes samples of the sound signal into the memory to thereby provide a running set of the samples in the memory such that a total number of the samples in the running set increments each time one or more of new sample is added to the running set until the total number of the samples corresponds to the predetermined length of the observation period;
  a calculating section that recurrently reads out the running set of the samples from the memory each time one ore more of new sample is added to the running set, and that recurrently calculates a running frequency characteristic of the sound signal on a common frequency axis for the observation period from the recurrently read running set of the samples;
  an accumulating section that accumulates the recurrently calculated running frequency characteristics on the common frequency axis so as to emphasize a howling frequency component contained in the sound signal; and
  an output section that produces an output frequency spectrum representing the emphasized howling frequency component from the accumulated running frequency characteristics.

31. The apparatus according to claim 30, further comprising a separating section that separates the running frequency characteristic into a real part and an imaginary part, so that the accumulating section accumulates the real part of the running frequency characteristic on the common frequency axis and accumulates the imaginary part of the running frequency characteristic on the common frequency axis independently from the real part, and then combines the accumulated real parts and the accumulated imaginary parts with each other to provide a composite frequency characteristic which is equivalent to the accumulated running frequency characteristics.

32. The apparatus according to claim 30, wherein the sampling section includes a pre-weighting section that pre-weights each sample of the sound signal successively sampled during the observation period by using a signal analysis window function which is provided to cover the predetermined length of the observation period so that the running set is composed of the pre-weighted samples.

33. The apparatus according to claim 32, wherein the pre-weighting section uses an inverse index window function as the signal analysis window function such that early samples in the observation period is pre-weighted greater than recent samples in the same observation period.

34. The apparatus according to claim 32, wherein the pre-weighting section uses the samples of the sound signal as the signal analysis window function for pre-weighting the samples, so that each pre-weighted sample is provided in the form of a square of each sample.

35. The apparatus according to claim 30, further including a detecting section that detects an actual howling frequency from the output frequency spectrum containing one or more of the emphasized howling frequency component.

36. The apparatus according to claim 35, further including an adaptive filter section that is inserted in the acoustic feedback system and that is controlled according to the detected howling frequency so as to reduce a gain of a frequency range of the sound signal around the detected howling frequency.

37. An apparatus capable of emphasizing a howling frequency component of a sound signal observed in an acoustic feedback system during an observation period having a predetermined length, the apparatus comprising:
a sampling section that is provided with a memory and that successively samples the sound signal from the acoustic feedback system and sequentially writes samples of the sound signal into the memory to thereby define a running set of the samples arranged sequentially along a common time axis such that a total number of the samples in the running set increments each time one or more of new sample is added to the running set until the total number of the samples corresponds to the predetermined length of the observation period;
an accumulating section that recurrently reads out the running set of the samples from the memory each time one or more of new sample is added to the running set, and that accumulates the recurrently read running sets of the samples on the common time axis so as to emphasize a howling frequency component contained in the sound signal;
a calculating section that calculates a frequency characteristic of the accumulated running sets of the samples; and
an output section that produces an output frequency spectrum presenting the emphasized howling frequency component based on the calculated frequency characteristic.

38. The apparatus according to claim 37, wherein the sampling section includes a pre-weighting section that pre-weights each sample of the sound signal successively sampled during the observation period by using a signal analysis window function which is provided to cover the predetermined length of the observation period so that the running set is composed of the pre-weighted samples.

39. The apparatus according to claim 38, wherein the pre-weighting section uses an inverse index window function as the signal analysis window function such that early samples in the observation period is pre-weighted greater than recent samples in the same observation period.

40. The apparatus according to claim 38, wherein the pre-weighting section uses the samples of the sound signal as the signal analysis window function for pre-weighting the samples, so that each pre-weighted sample is provided in the form of a square of each sample.

41. The apparatus according to claim 37, further including a detecting section that detects an actual howling frequency from the output frequency spectrum containing one or more of the emphasized howling frequency component.

42. The apparatus according to claim 41, further including an adaptive filter section that is inserted in the acoustic feedback system and that is controlled according to the detected howling frequency so as to reduce a gain of a frequency range of the sound signal around the detected howling frequency.

43. An apparatus capable of emphasizing a howling frequency component of a sound signal observed in an acoustic feedback system during an observation period having a predetermined length, the apparatus comprising:
a sampling section that is provided with a memory and that successively samples the sound signal from the acoustic feedback system and sequentially writes samples of the sound signal into the memory to thereby define a running set of the samples arranged along a common time axis sequentially from early samples to recent samples so that a total number of the samples in the running set increments each time one or more of new sample is added after the recent samples of the running set until the total number of the samples corresponds to the predetermined length of the observation period;
a weighting section that recurrently reads out the running set of the samples from the memory each time one or more of new sample is added to the running set, and that weights each sample contained in the recurrently read running set using a triangular function such that the early samples are weighted greater than the recent samples so as to emphasize a howling frequency component of the sound signal;
a calculating section that calculates a frequency characteristic of the sound signal for the observation period based on the recurrently read running sets each containing the weighted samples; and
an output section that produces an output frequency spectrum presenting the emphasized howling frequency component based on the calculated frequency characteristic.

44. The apparatus according to claim 43, wherein the sampling section includes a pre-weighting section that pre-weights each sample of the sound signal successively sampled during the observation period by using a signal analysis window function which is provided to cover the predetermined length of the observation period so that the running set is composed of the pre-weighted samples.

45. The apparatus according to claim 44, wherein the pre-weighting section uses an inverse index window function as the signal analysis window function such that early samples in the observation period is pre-weighted greater than recent samples in the same observation period.

46. The apparatus according to claim 44, wherein the pre-weighting section uses the samples of the sound signal as the signal analysis window function for pre-weighting the samples, so that each pre-weighted sample is provided in the form of a square of each sample.

47. The apparatus according to claim 43, further including a detecting section that detects an actual howling frequency from the output frequency spectrum containing one or more of the emphasized howling frequency component.

48. The apparatus according to claim 47, further including an adaptive filter section that is inserted in the acoustic feedback system and that is controlled according to the detected howling frequency so as to reduce a gain of a frequency range of the sound signal around the detected howling frequency.

* * * * *